(12) United States Patent
Fujii

(10) Patent No.: US 11,343,915 B2
(45) Date of Patent: May 24, 2022

(54) SEMICONDUCTOR DEVICE

(71) Applicant: SHINKO ELECTRIC INDUSTRIES CO., LTD., Nagano (JP)

(72) Inventor: Tomoharu Fujii, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 214 days.

(21) Appl. No.: 16/869,995

(22) Filed: May 8, 2020

(65) Prior Publication Data
US 2020/0367361 A1 Nov. 19, 2020

(30) Foreign Application Priority Data

May 14, 2019 (JP) .............................. JP2019-091286

(51) Int. Cl.
| | |
|---|---|
| *H05K 1/14* | (2006.01) |
| *H05K 3/46* | (2006.01) |
| *H01L 23/498* | (2006.01) |
| *H05K 7/02* | (2006.01) |
| *H01L 23/66* | (2006.01) |
| *H01Q 21/06* | (2006.01) |

(52) U.S. Cl.
CPC ....... *H05K 1/144* (2013.01); *H01L 23/49816* (2013.01); *H01L 23/49833* (2013.01); *H01L 23/49894* (2013.01); *H01L 23/66* (2013.01); *H01Q 21/065* (2013.01); *H05K 3/4694* (2013.01); *H05K 7/023* (2013.01); *H01L 2223/6677* (2013.01)

(58) Field of Classification Search
CPC ............ H01L 23/66; H01L 2223/6677; H01Q 21/065
See application file for complete search history.

(56) References Cited

U.S. PATENT DOCUMENTS

| | | | |
|---|---|---|---|
| 9,941,226 B2 * | 4/2018 | Tsai | ........................ H01L 24/73 |
| 10,594,019 B2 | 3/2020 | Baks et al. | |
| 2020/0052393 A1 * | 2/2020 | Fang | ..................... H01Q 9/0414 |
| 2020/0303806 A1 * | 9/2020 | Wu | ........................ H01L 23/552 |

FOREIGN PATENT DOCUMENTS

JP 2018-093491 6/2018

* cited by examiner

*Primary Examiner* — David A Zarneke
(74) *Attorney, Agent, or Firm* — IPUSA, PLLC

(57) ABSTRACT

A semiconductor device includes a first wiring board having a first surface mounted with a primary radiator, and a second surface mounted with a semiconductor chip, a second wiring board mounted with a secondary radiator that forms an antenna with the primary radiator, and a third wiring board, arranged between the first and second wiring boards, and forming a predetermined gap with each of the first and second wiring boards. A first board-to-board connection member is arranged between the first and third wiring boards, to form a space between the first and third wiring boards, and regulate the spacing between the first and third wiring boards. A second board-to-board connection member is arranged between the second and third wiring boards, to form a space between the second and third wiring boards, and regulate a spacing between the second and third wiring boards.

11 Claims, 6 Drawing Sheets

SEMICONDUCTOR DEVICE

CROSS-REFERENCE TO RELATED APPLICATION

This application is based upon and claims priority to Japanese Patent Application No. 2019-091286, filed on May 14, 2019, the entire contents of which are incorporated herein by reference.

FIELD

Certain aspects of the embodiments discussed herein are related to a semiconductor device.

BACKGROUND

Conventionally, there is a known semiconductor device including a patch array antenna, and a semiconductor chip that is connected to the antenna and processes high-frequency signals.

The semiconductor device described above may include a first wiring board mounted with the semiconductor chip, and a second wiring board formed with at least a portion of the patch array antenna, and the second wiring board may be laminated on the first wiring board. For example, Japanese Laid-Open Patent Publication No. 2018-93491 describes an example of such a semiconductor device including the laminated first and second wiring boards.

However, a structure of the semiconductor device described above tends to become highly asymmetrical along a vertical direction, that is, in a direction in which the wiring boards are laminated, when securing a satisfactory antenna performance of the semiconductor device. Further, the highly asymmetrical structure along the vertical direction of the semiconductor device may cause the semiconductor device to warp.

SUMMARY

Accordingly, it is an object in one aspect of the embodiments to reduce the warp of the semiconductor device including the antenna and the semiconductor chip.

According to one aspect of the embodiments, a semiconductor device includes a first wiring board having a first surface mounted with a primary radiator, and a second surface mounted with a semiconductor chip; a second wiring board mounted with a secondary radiator, the primary radiator and the secondary radiator forming an antenna; a third wiring board, arranged between the first wiring board and the second wiring board, a predetermined gap being formed between the third wiring board and each of the first wiring board and the second wiring board; a first board-to-board connection member, arranged between the first wiring board and the third wiring board, forming a space between the first wiring board and the third wiring board, and regulating the spacing between the first wiring board and the third wiring board; and a second board-to-board connection member, arranged between the second wiring board and the third wiring board, forming a space between the second wiring board and the third wiring board, and regulating a spacing between the second wiring board and the third wiring board.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
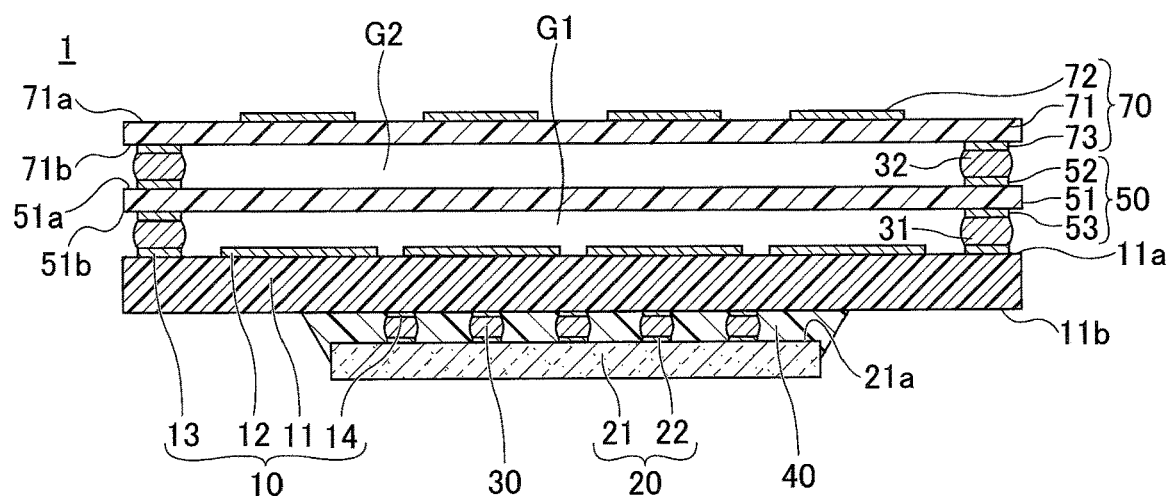
FIG. 1A and FIG. 1B are diagrams illustrating an example of the semiconductor device according to a first embodiment.

Embodiments of the present invention will be described with reference to the accompanying drawings. In the drawings, those parts that are the same are designated by the same reference numerals, and a repeated description of the same parts may be omitted.

A description will now be given of the semiconductor device according to each embodiment of the present invention.

First Embodiment

[Structure of Semiconductor Device According to First Embodiment]

Figure 1B:
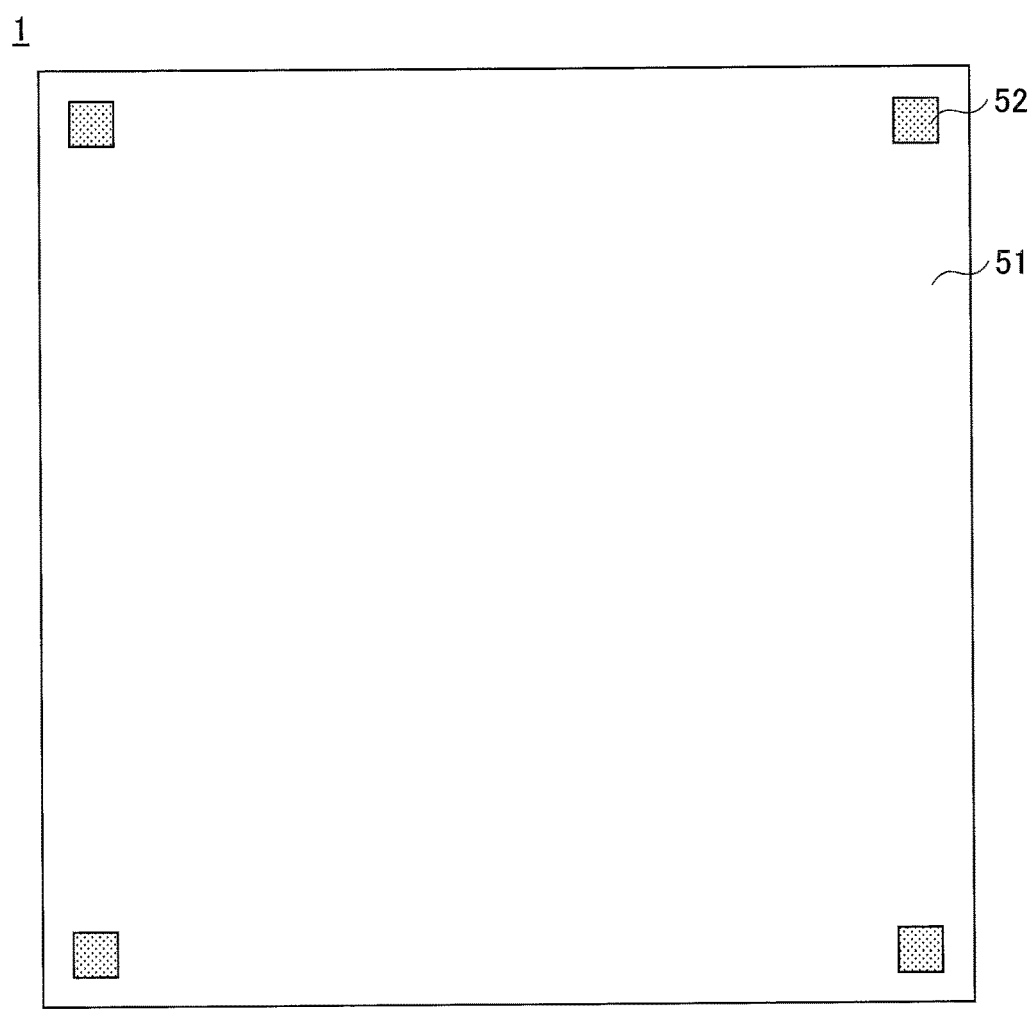

FIG. 1A and FIG. 1B are diagrams illustrating an example of the semiconductor device according to a first embodiment. FIG. 1A is a cross sectional view of the semiconductor device, and FIG. 1B is a plan view of an insulating layer 51 of the semiconductor device.

As illustrated in FIG. 1A and FIG. 1B, a semiconductor device 1 includes a wiring board 10, a semiconductor chip 20, bumps 30 through 32, an underfill resin 40, a wiring board 50, and a wiring board 70.

In this embodiment, for the sake of convenience, the side of the semiconductor device 1, on the side of the wiring board 70, will be referred to as an upper side or a first side of the semiconductor device 1. The side of the semiconductor device 1, on the side of the semiconductor chip 20, will be referred to as a lower side or a second side of the semiconductor device 1. In addition, the side of each component on the side of the wiring board 70 will be referred to as the first side or the upper surface, and the side of each component on the side of the semiconductor chip will be referred to as the second side or the lower side. However, the semiconductor device 1 may be used in an up-side-down state, or in a state arranged at an arbitrary angle with respect to a horizontal surface. Further, a plan view of the component refers to a view of the component viewed from above in a direction normal to a first surface 11a of an insulating layer 11. A planar shape of the component refers to a shape of the component in the plan view viewed from above in the direction normal to the first surface 11a of the insulating layer 11.

The wiring board 10 includes the insulating layer 11, a primary radiator 12, board connection pads 13, and chip connection pads 14.

In the wiring board 10, the insulating layer 11 may be formed by insulating resins, such as epoxy resins, imide resins, phenol resins, cyanate resins, or the like, for example. The insulating resin forming the insulating layer 11 may be a thermosetting resin or a photosensitive resin. In addition, the insulating layer 11 may include a reinforcing member. Examples of the reinforcing member include woven fabrics, nonwoven fabrics, or the like made of glass fibers, carbon fibers, aramid fibers, or the like, for example. The insulating layer 11 may further include a filler, such as silica ($SiO_2$) or the like. A thickness of the insulating layer 11 may be approximately 50 μm to approximately 500 μm, for example. However, the wiring board 10 may be a ceramic board, a silicon board, or the like, instead of the resin board.

The primary radiator 12 and the board connection pads 13 are formed on the first surface 11a of the insulating layer 11. The board connection pads 13 may be arranged near the four corners on the first surface 11a of the insulating layer 11, for example. Examples of the material that may be used to form the primary radiator 12 and the board connection pads 13 include copper (Cu) or the like, for example. A thickness of the primary radiator 12 and the board connection pads 13 may be approximately 5 μm to approximately 20 μm, for example.

The chip connection pads 14 are formed on a second surface 11b of the insulating layer 11, opposite to the first surface 11a. The chip connection pads 14 are arranged near a center on the second surface 11b of the insulating layer 11. Examples of the material that may be used to form the chip connection pads 14 include copper (Cu) or the like, for example. A thickness of the chip connection pads 14 may be approximately 5 μm to approximately 20 μm, for example.

Although FIG. 1 is a simplified illustration of the wiring board 10, interconnect patterns that are not illustrated in FIG. 1 may be formed on the first surface 11a or the second surface 11b of the insulating layer 11, or inside the insulating layer 11. In addition, such interconnect patterns may be mutually connected using via interconnects. For example, the primary radiator 12 and the chip connection pads 14 may be connected by an interconnect pattern for supplying power to the primary radiator 12. The wiring board 10 may include an insulating layer other than the insulating layer 11, such as a solder resist layer or the like, as appropriate.

The semiconductor chip 20 includes a main body 21 that includes a semiconductor integrated circuit, and electrode pads 22 that are provided on a circuit forming surface 21a of the main body 21. The semiconductor chip 21 is mounted on the second surface 11b of the insulating layer 11 by flip-chip bonding, in a face-down state where the circuit forming surface 21a faces the second surface 11b of the insulating layer 11.

More particularly, the electrode pads 22 of the semiconductor chip 20 are electrically connected to the chip connection pads 14 via the bumps 30. The bumps 30 are solder bumps, for example. Examples of the solder bump material include alloys including Pb, alloys of Sn and Cu, alloys of Sn and Ag, alloys of Sn, Ag, and Cu, alloys of Sn and Bi, or the like, for example.

The second surface 11b of the insulating layer 11 and the circuit forming surface 21a of the semiconductor chip 20 oppose each other, and the underfill resin 40 is provided between these opposing surfaces 11b and 21a. The semiconductor chip 20 may be a radio frequency integrated circuit (RFIC) that is connected to an antenna and processes high-frequency signals, for example.

The wiring board 50 includes the insulating layer 51, board connection pads 52, and board connection pads 53. The wiring board 50 is arranged between the first surface 11a of the insulating layer 11 of the wiring board 10, and a second surface 71b of an insulating layer 71 of the wiring board 70, and a predetermined gap or spacing is formed between the wiring board 50 and each of the wiring board 10 and the wiring board 70.

In the wiring board 50, the insulating layer 51 preferably has a dielectric constant and a dielectric loss tangent lower than those of the insulating layer 11. The insulating layer 51 may be formed by insulating resins, such as epoxy resins, imide resins, phenol resins, cyanate resins, fluororesins, or the like, for example. The insulating resin forming the insulating layer 51 may be a thermosetting resin or a photosensitive resin. In addition, the insulating layer 51 may include a reinforcing member. Examples of the reinforcing member include woven fabrics, nonwoven fabrics, or the like made of glass fibers, carbon fibers, aramid fibers, or the like, for example. The insulating layer 51 may further include a filler, such as silica ($SiO_2$) or the like. A thickness of the insulating layer 51 may be approximately 50 μm to approximately 200 μm, for example.

The board connection pads 52 are formed on a first surface 51a of the insulating layer 51. As illustrated in FIG. 1B, the board connection pads 52 may be arranged near the four corners on the first surface 51a of the insulating layer 51, for example. The board connection pads 53 may be arranged near the four corners on a second surface 51b of the insulating layer 51, at positions opposing the board connection pads 13 of the wiring board 10, for example. In addition, the board connection pads 53 may be arranged at positions opposing the board connection pads 52, via the insulating layer 51, for example.

Examples of the material that may be used to form the board connection pads 52 and 53 include copper (Cu) or the like, for example. A thickness of the board connection pads 52 and 53 may be approximately 5 μm to approximately 20 μm, for example.

The bumps 31, that form a space G1 between the wiring board 10 and the wiring board 50, and regulate the gap or spacing between the wiring board 10 and the wiring board 50, are arranged between the wiring board 10 and the wiring board 50. Each of the board connection pads 53 is electrically connected to the board connection pad 13 that is located at an opposing position on the wiring board 10, via the bump 31. The bumps 31 are solder bumps similar to the bumps 30, for example. The bumps 31 may be metal core balls, such as copper core balls or the like.

The wiring board 50 may include interconnect patterns, such as a ground pattern or the like, on the first surface 51a or the second surface 51b of the insulating layer 51, or inside the insulating layer 51, as appropriate. Such interconnect patterns may be mutually connected using via interconnects. In addition, the wiring board 50 may include an insulating layer other than the insulating layer 51, such as a solder resist layer or the like, as appropriate.

The wiring board 70 includes the insulating layer 71, a secondary radiator 72, and board connection pads 73.

In the wiring board 70, the insulating layer 71 preferably has a dielectric constant and a dielectric loss tangent lower than those of the insulating layer 11. The insulating layer 71 may be formed by insulating resins, such as epoxy resins, imide resins, phenol resins, cyanate resins, fluororesins, or the like, for example. The insulating resin forming the insulating layer 71 may be a thermosetting resin or a photosensitive resin. In addition, the insulating layer 71 may include a reinforcing member. Examples of the reinforcing member include woven fabrics, nonwoven fabrics, or the like made of glass fibers, carbon fibers, aramid fibers, or the like, for example. The insulating layer 71 may further include a filler, such as silica ($SiO_2$) or the like. A thickness of the insulating layer 71 may be approximately 50 μm to approximately 200 μm, for example.

The secondary radiator 72 is formed on a first surface 71*a* of the insulating layer 71. The board connection pads 73 are formed on the second surface 71*b* of the insulating layer 71. The board connection pads 73 may be arranged near the four corners on the second surface 71*b* of the insulating layer 71, at positions opposing the board connection pads 52 of the wiring board 50, for example.

Examples of the material that may be used to form the secondary radiator 72 and the board connection pads 73 include copper (Cu) or the like, for example. A thickness of the secondary radiator 72 and the board connection pads 73 may be approximately 5 μm to approximately 20 μm, for example.

The bumps 32, that form a space G2 between the wiring board 70 and the wiring board 50, and regulate the gap or spacing between the wiring board 70 and the wiring board 50, are arranged between the wiring board 70 and the wiring board 50. Each of the board connection pads 73 is electrically connected to the board connection pad 52 that is located at an opposing position on the wiring board 50, via the bump 32. The bumps 32 are solder bumps similar to the bumps 30, for example. The bumps 32 may be metal core balls, such as copper core balls or the like.

The wiring board 70 may include interconnect patterns, such as a ground pattern or the like, on the first surface 71*a* or the second surface 71*b* of the insulating layer 71, or inside the insulating layer 71, as appropriate. Such interconnect patterns may be mutually connected using via interconnects. In addition, the wiring board 70 may include an insulating layer other than the insulating layer 71, such as a solder resist layer or the like, as appropriate.

Accordingly, the semiconductor device 1 has a structure in which the wiring board 50 is laminated, via the bumps 31, on the wiring board 10 that is mounted with the semiconductor chip 20, and the wiring board 70 is laminated, via the bumps 32, on the wiring board 50. In the semiconductor device 1, the space G1 is formed between the opposing surfaces of the wiring board 10 and the wiring board 50. In addition, the space G2 is formed between the opposing surfaces of the wiring board 50 and the wiring board 70.

In the semiconductor device 1, the primary radiator 12 and the secondary radiator 72 form an antenna. The primary radiator 12 and the secondary radiator 72 form a patch array antenna in the extremely high frequency (EHF) or millimeter band, for example.

[Method of Manufacturing Semiconductor Device According to First Embodiment]

Next, a method of manufacturing the semiconductor device according to the first embodiment will be described. FIG. 2A, FIG. 2B, FIG. 2C, and FIG. 2D are diagrams for explaining processes or steps of manufacturing the semiconductor device according to the first embodiment.

Figure 2A:
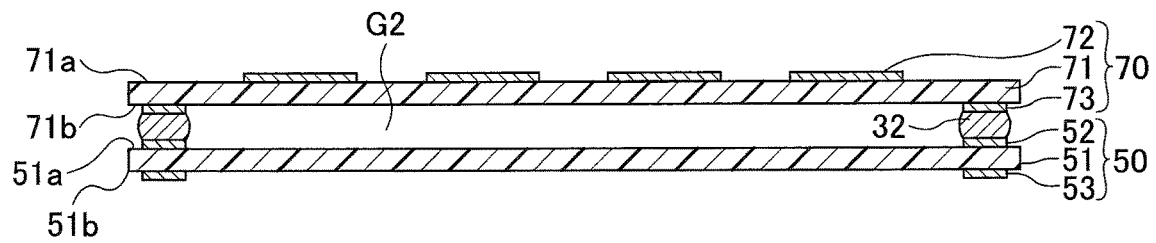
FIG. 2A, FIG. 2B, FIG. 2C, and FIG. 2D are diagrams for explaining processes of manufacturing the semiconductor device according to the first embodiment.

First, in the process of step illustrated in FIG. 2A, the wiring board 50 having the board connection pads 52 formed on the first surface 51*a* of the insulating layer 51, and the board connection pads 53 formed on the second surface 51*b* of the insulating layer 51, is prepared. In addition, the wiring board 70 having the secondary radiator 72 formed on the first surface 71*a* of the insulating layer 71, and the board connection pads 73 formed on the second surface 71*b* of the insulating layer 71, is prepared.

Next, the wiring board 50 is laminated on the wiring board 70. More particularly, a solder cream or the like, that becomes the bumps 32, is coated on the board connection pads 52 of the wiring board 50, for example, and the wiring board 70 is arranged on the wiring board 50 so that the board connection pads 73 of the wiring board 70 are positioned on the solder cream or the like.

Then, the solder cream or the like is melted and thereafter solidified by reflow or the like, to form the bumps 32. Hence, the board connection pads 52 are connected to the board connection pads 73 via the bumps 32, and as a result, the wiring board 50 is laminated on the wiring board 70.

Figure 2B:
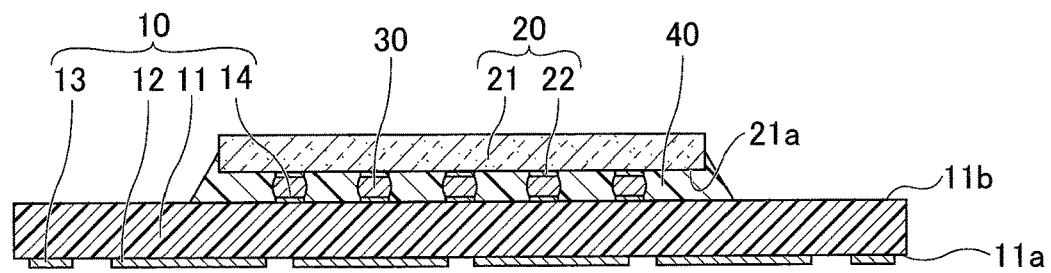

Next, in the process or step illustrated in FIG. 2B, the wiring board 10 having the primary radiator 12 and the board connection pads 13 formed on the first surface 11*a* of the insulating layer 11, and the chip connection pads 14 formed on the second surface 11*b* of the insulating layer 11, is prepared.

Then, the semiconductor chip 20 is mounted on the wiring board 10 by flip-chip bonding. More particularly, a solder cream or the like, that becomes the bumps 30, is coated on the chip connection pads 14 of the wiring board 10, for example, and the semiconductor chip 20 is arranged on the wiring board 10 so that the electrode pads 22 of the semiconductor chip 20 are positioned on the solder cream or the like.

Then, the solder cream or the like is melted and thereafter solidified by reflow or the like, to form the bumps 30. Hence, the electrode pads 22 are connected to the chip connection pads 14 via the bumps 30, and as a result, the semiconductor chip 20 is mounted on the wiring board 10 by flip-chip bonding. Further, the underfill resin 40 is cast between the second surface 11*b* of the insulating layer 11 and the circuit forming surface 21*a* of the semiconductor chip 20, and the underfill resin 40 is cured.

Figure 2C:
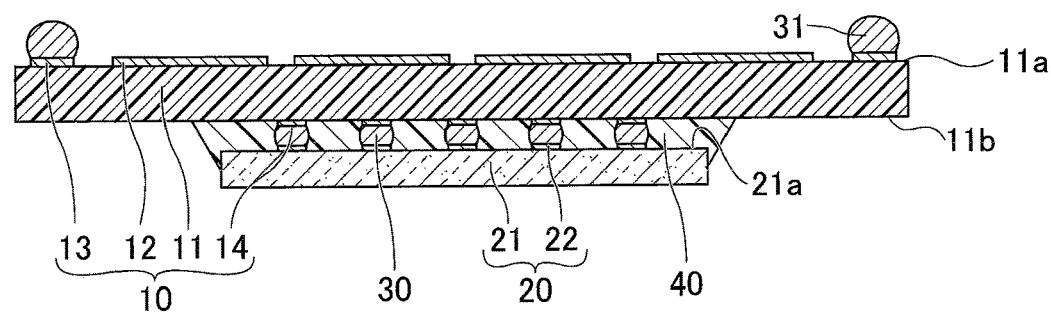

Next, in the process or step illustrated in FIG. 2C, the structure illustrated in FIG. 2B is turned up-side down, and a solder cream or the like that becomes the bumps 31 is coated on the board connection pads 13 of the wiring board 10.

Figure 2D:
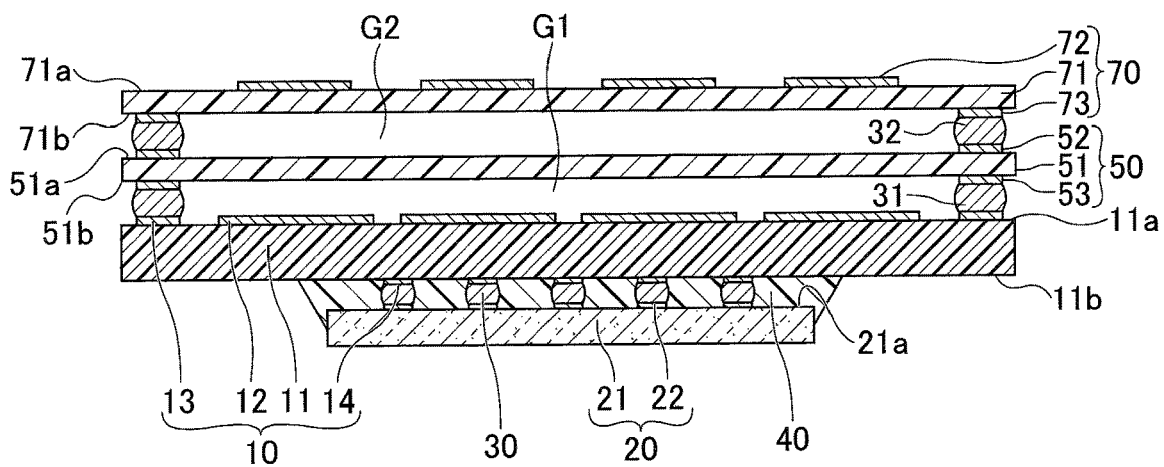

Next, in the process or step illustrated in FIG. 2D, the structure illustrated in FIG. 2A is arranged on the structure illustrated in FIG. 2C, so that the board connection pads 53 of the structure illustrated in FIG. 2A are positioned on the solder cream or the like.

Then, the solder cream or the like is melted and thereafter solidified by reflow or the like, to form the bumps 31. Hence, the board connection pads 53 are connected to the board connection pads 13 via the bumps 31, to complete the semiconductor device 1.

[Antenna Performance]

An antenna performance of the primary radiator 12 and the secondary radiator 72 of the semiconductor device 1 will be described.

The antenna performance of the primary radiator 12 and the secondary radiator 72 is affected by a distance between the primary radiator 12 and the secondary radiator 72, including thicknesses of the insulating layers 51 and 71, and electrical characteristics of the insulating layers 51 and 71, including the dielectric constant, the dielectric loss tangent, or the like. In order to improve the antenna performance of the primary radiator 12 and the secondary radiator 72, the insulating layers 51 and 71 preferably have a low dielectric constant and a low dielectric loss tangent.

In a case where the primary radiator 12 and the secondary radiator 72 form the patch array antenna in the EHF or millimeter band, the distance between the first surface 11a of the wiring board 10 and the second surface 71b of the wiring board 70 may be approximately 500 μm to approximately 2000 μm, for example.

In addition, the distance between the first surface 11a of the wiring board 10 and the second surface 51b of the wiring board 50, that is, the height of the space G1, may be approximately 50 μm to approximately 500 μm, for example. Moreover, the distance between the first surface 51a of the wiring board 50 and the second surface 71b of the wiring board 70, that is, the height of the space G2, may be approximately 50 μm to approximately 500 μm, for example.

Figure 3:
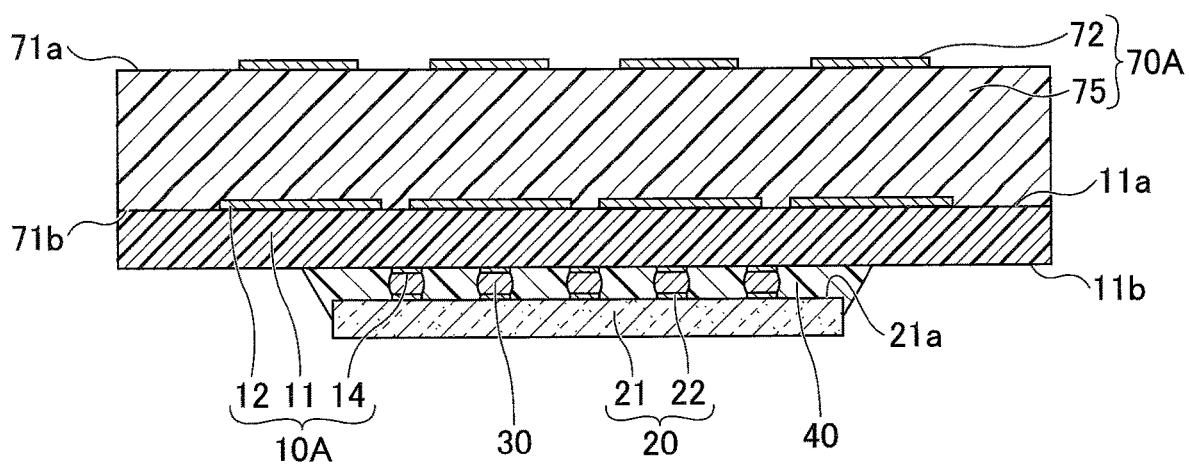
FIG. 3 is a cross sectional view illustrating an example of a semiconductor device according to a comparison example.

FIG. 3 is a cross sectional view illustrating an example of a semiconductor device according to a comparison example. As illustrated in FIG. 3, a semiconductor device 1X according to this comparison example has a general structure including a wiring board 10A, the semiconductor chip 20, the bumps 30, the underfill resin 40, and a wiring board 70A.

The wiring board 10A has a structure similar to that of the wiring board 10, except that the board connection pads 13 are not formed on the wiring board 10A. The wiring board 70A has a structure similar to that of the wiring board 70, except that the board connection pads 73 are not formed on the wiring board 70A, and an insulating layer 75 of the wiring board 70A is thicker than the insulating layer 71.

The insulating layer 75 of the wiring board 70A is directly bonded onto the first surface 11a of the insulating layer 11 of the wiring board 70A. In other words, the semiconductor device 1X does not have spaces corresponding to the spaces G1 and G2 of the semiconductor device 1.

In the semiconductor device 1X, the insulating layer 75 needs to be thick to a certain extent, in order to optimize the distance between the primary radiator 12 and the secondary radiator 72 by taking into consideration the antenna performance. However, when the insulating layer 75 is made thick, it is difficult to reduce the dielectric constant and the dielectric loss tangent, thereby making it difficult to obtain a satisfactory antenna performance.

Accordingly, in the semiconductor device 1, the single insulating layer 75 of the semiconductor device 1X is modified into two-layer structure, namely, the insulating layer 51 of the wiring board 50 and the insulating layer 71 of the wiring board 70. Hence, the semiconductor device 1 as a whole has a three-layer structure for the insulating layers, including the insulating layer 11 of the wiring board 10. In addition, the space G1 is formed between the opposing surfaces of the wiring board 10 and the wiring board 50, and the space G2 is formed between the opposing surfaces of the wiring board 50 and the wiring board 70.

Air fills the spaces G1 and G2, and the dielectric constant of air is 1 and lower than the dielectric constant of the resin forming each of the insulating layers. Further, the dielectric loss tangent of air is 0 and lower than the dielectric loss tangent of the resin forming each of the insulating layers.

In other words, because the semiconductor device 1 has the three-layer structure for the insulating layers, it is possible to form the spaces G1 and G2, having the dielectric constant and the dielectric loss tangent lower than those of the insulating layer 75 of the semiconductor device 1X, between the wiring board 10 and the wiring board 70. As a result, according to the semiconductor device 1, it is possible to improve the antenna performance of the primary radiator 12 and the secondary radiator 72 when compared to the antenna performance of the semiconductor device 1X.

Furthermore, when at least one of the insulating layer 51 and the insulating layer 71 includes the fluororesin, such as polytetrafluoroethylene or the like, having a low dielectric constant and a low dielectric loss tangent, it is possible to further improve the antenna performance of the primary radiator 12 and the secondary radiator 72.

[Warp of Semiconductor Device]

In the semiconductor device 1X, the insulating layer 75 needs to be thick to a certain extent, in order to optimize the distance between the primary radiator 12 and the secondary radiator 72 by taking into consideration the antenna performance. In addition, in most cases, the dielectric constant and the dielectric loss tangent of the material used for the insulating layer 75 are lower than those of the insulating layer 71, from the viewpoint of improving the antenna performance.

As a result, due to the difference between the thicknesses of the insulating layer 75 and the insulating layer 11, the structure of the semiconductor device 1X tends to become highly asymmetrical along the vertical direction, that is, in the direction in which the wiring boards are laminated, and cause the semiconductor device 1X to easily warp. In addition, the difference between the coefficients of thermal expansion of the insulating layer 75 and the insulating layer 11, due to the different materials used for the insulating layer 75 and the insulating layer 11, may further cause the semiconductor device 1X to more easily warp.

On the contrary, the warp of the semiconductor device 1 can easily be controlled, because the semiconductor device 1 has the three-layer structure for the insulating layers, and the thicknesses of the insulating layer 51 and the insulating layer 71 are adjustable while optimizing the distance between the primary radiator 12 and the secondary radiator 72.

In addition, because the semiconductor device 1 has the three-layer structure for the insulating layers, different materials may be selected for the insulating layer 51 and the insulating layer 71, as appropriate, the warp of the semiconductor device 1 can be controlled with ease. For example, the insulating layer 11, the insulating layer 51, and the insulating layer 71 may be formed using materials having mutually different coefficients of thermal expansion.

When the materials used for the insulating layers 11, 51, and 71 are selected so that the coefficient of thermal expansion of the insulating layer falls in-between the coefficient of thermal expansion of the insulating layer 11 and the coefficient of thermal expansion of the insulating layer 71, it is possible to reduce the warp of the semiconductor device 1 because the differences of the coefficients of thermal expansion for the semiconductor device 1 as a whole become gradual.

Figure 6:
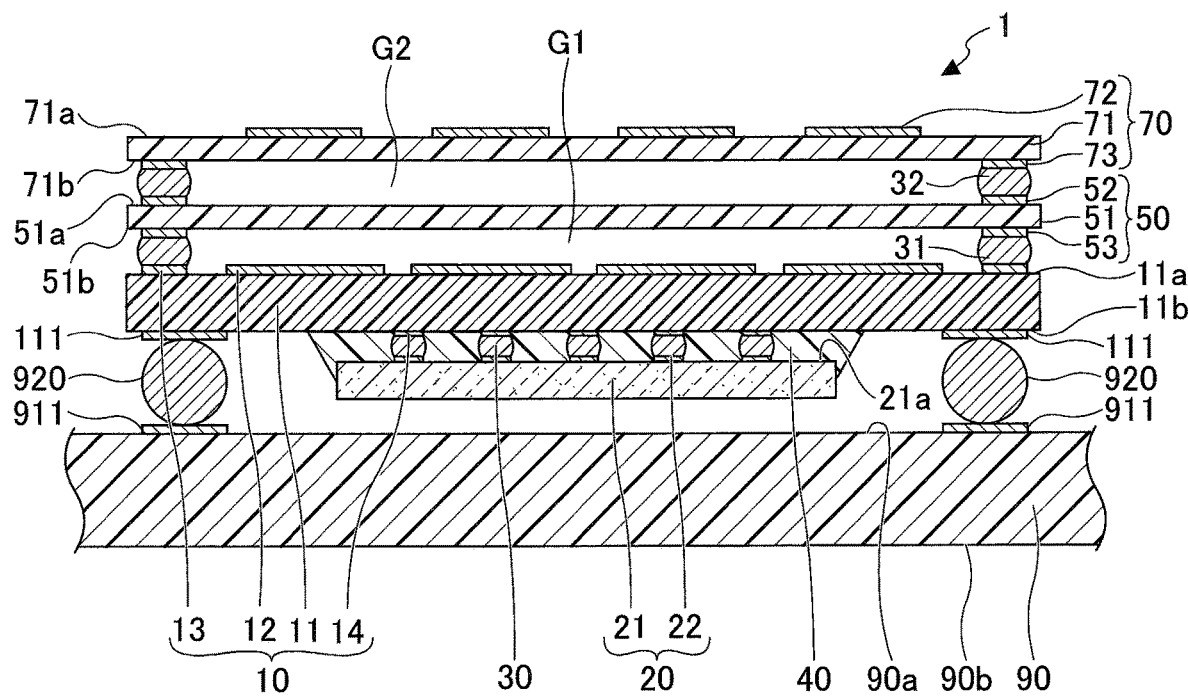
FIG. 6 is a diagram illustrating an example of the semiconductor device according to a fourth embodiment.

As illustrated in FIG. 6 of Japanese Laid-Open Patent Publication No. 2018-93491, for example, a proposed structure for the semiconductor device provides a space by interposing a frame structure between two wiring boards. According to this proposed structure, an improvement of the antenna performance may also be expected.

However, the proposed structure becomes highly asymmetrical along the vertical direction, that is, in the direction in which the wiring boards are laminated, and may cause the boards to warp. Unlike the semiconductor device 1 described above, the proposed structure cannot select the material of the insulating layer 51 to have the coefficient of thermal expansion that falls in-between the coefficients of thermal expansion of the insulating layer 11 and the insulating layer 71. Accordingly, from the viewpoint of reducing the warp, the structure of the semiconductor device 1 is more advantageous compared to the proposed structure for the semiconductor device illustrated in FIG. 6 of Japanese Laid-Open Patent Publication No. 2018-93491, for example.

In addition, from the viewpoint of reducing the overall thickness of the semiconductor device, the structure of the semiconductor device 1 is more advantageous compared to the proposed structure for the semiconductor device illustrated in FIG. 6 of Japanese Laid-Open Patent Publication No. 2018-93491, for example. This is because, according to the semiconductor device 1, the wiring board 50 that forms an intermediate layer has a dielectric constant higher than the dielectric constant of air, to enable the wavelength of the antenna to be reduced, and thereby shorten the distance required between the primary radiator 12 and the secondary radiator 72.

Second Embodiment

A second embodiment forms the board connection pads as a frame-shaped board connection pattern. In the second embodiment, those parts that are the same as the first embodiment are designated by the same reference numerals, and a repeated description of the same parts may be omitted.

Figure 4:
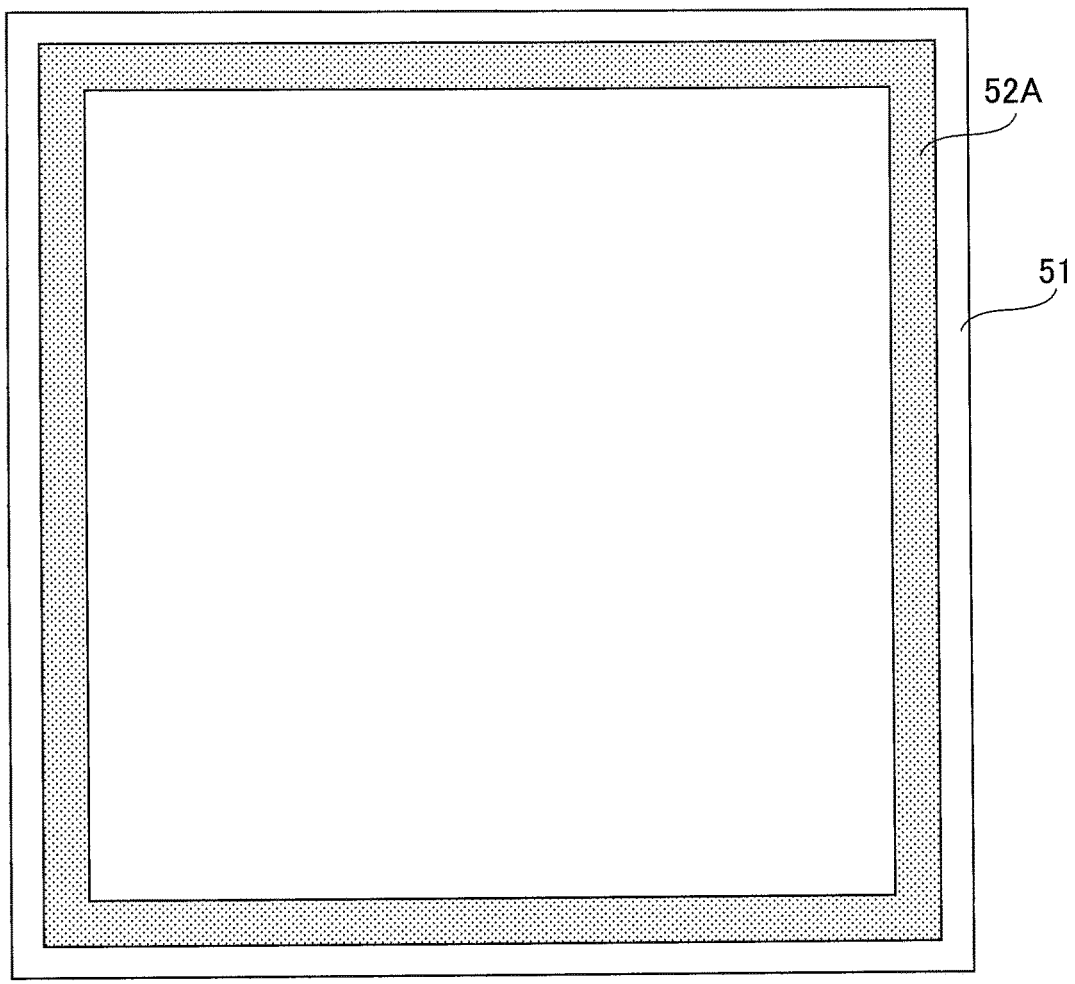
FIG. 4 is a plan view illustrating an insulating layer and a board connection pattern of the semiconductor device according to a second embodiment.

FIG. 4 is a plan view illustrating an insulating layer and a board connection pattern of the semiconductor device according to the second embodiment. In FIG. 1B, the board connection pads 52 are provided near the four corners on the first surface 51a of the insulating layer 51. However, the layout and arrangement of the board connection pads 52 are not limited to those of the first embodiment. As illustrated in FIG. 4, for example, a frame-shaped board connection pattern 52A of the second embodiment may be provided in place of the board connection pads 52. In addition, a solder resist layer including a plurality of openings may be provided on the first surface 51a of the insulating layer 51, and an upper surface of the board connection pattern 52A may be exposed within each of the plurality of openings in the solder resist layer.

In the second embodiment, the board connection pads 13, 53, and 73 are also replaced by a frame-shaped pattern similar to the board connection pattern 52A. Hence, the bumps can be arranged in a peripheral pattern, and the wiring boards can be connected using a large number of bumps.

For example, when the board connection pattern 52A is the ground pattern, and this ground pattern is connected to the ground patterns of adjacent wiring boards, a stable ground potential can be obtained by arranging the bumps in the peripheral pattern and connecting the ground patterns using a large number of bumps.

Instead of using a continuous frame-shaped board connection pattern, independent board connection pads similar to the board connection pads 52 illustrated in FIG. 1B may be arranged in the frame-shape. In this case, the wiring boards may be connected using the bumps corresponding to the number of board connection pads 52.

Third Embodiment

A third embodiment uses variations of board-to-board connection members. In the third embodiment, those parts that are the same as the second embodiment are designated by the same reference numerals, and a repeated description of the same parts may be omitted.

FIG. 5A, FIG. 5B, FIG. 5C, and FIG. 5D are diagrams illustrating examples of the variations of the board-to-board connection members. FIG. 1A, FIG. 1B, or the like described above illustrate an example in which the bumps, such as the solder bumps or the like, are used as the board-to-board connection members that connect the wiring boards. However, the board-to-board connection members are not limited to those of the first embodiment, and for example, metal posts or the like, made of copper (Cu) or the like, may be used as the board-to-board connection members.

Figure 5A:
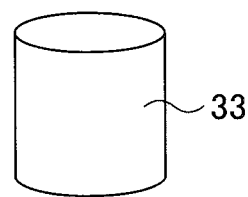
FIG. 5A, FIG. 5B, FIG. 5C, and FIG. 5D are diagrams illustrating examples of variations of board-to-board connection members.
Figure 5B:
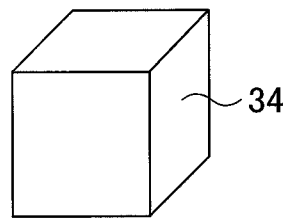
Figure 5C:
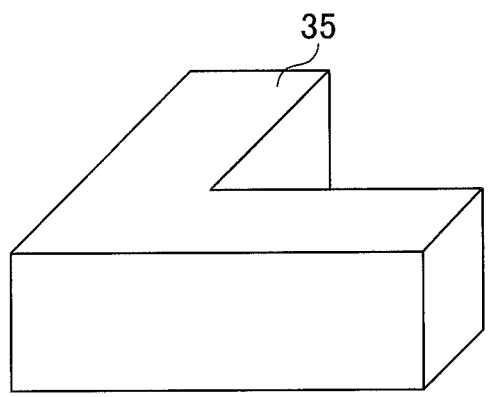

For example, a cylindrical column-shaped metal post 33 illustrated in FIG. 5A, or a rectangular column-shaped metal post 34 illustrated in FIG. 5B, may be used as the board-to-board connection member. In addition, the metal post used as the board-to-board connection member may have a polygonal column shape other than the rectangular column shape, such as an oval column shape. Moreover, four metal posts 35 having an approximate L-shape including an approximately 90-degree bend as illustrated in FIG. 5C, may be prepared as the board-to-board connection members and arranged near the four corners on the wiring board. Furthermore, two metal posts 36 having an approximate U-shape illustrated in FIG. 5D, may be prepared as the board-to-board connection member and arranged on the wiring board so that open portions of the approximate U-shapes oppose each other.

Figure 5D:
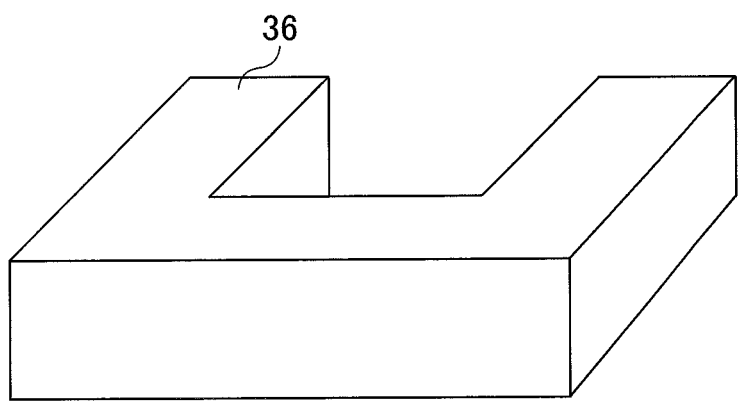

Alternatively, a single metal post 36 having the approximate U-shape illustrated in FIG. 5D may be arranged on the wiring board. In this case, the single metal post 36 is formed to a size that is approximately the same as the external size of the rectangular wiring board, and the single metal post 36 is arranged so that outer side surfaces of the approximate U-shape extends along three adjacent sides of each of the rectangular wiring boards located above and below the single metal post 36.

When the board-to-board connection member is formed by a conductive material, such as solder, copper (Cu) or the like, the board-to-board connection member not only functions as a gap or spacing regulating means for regulating the gap or spacing between the wiring boards, but can also function as an electrically connecting means for providing electrical connections between the wiring boards. In some cases, the electrical connection between the wiring boards is not required, and in such cases, the board-to-board connection member may be formed by a non-conductive material, such as resin, rubber, or the like.

Fourth Embodiment

FIG. 6 is a diagram illustrating an example of the semiconductor device according to a fourth embodiment. FIG. 6 is a cross sectional view of the semiconductor device, and those parts that are the same as those corresponding parts illustrated in FIG. 1A are designated by the same reference numerals, and a description thereof will be omitted.

In this embodiment, the semiconductor device 1, that forms an antenna module or the like, is mounted on a circuit board 90, such as a mother board or the like, for example. The semiconductor device 1 may be mounted on the circuit board 90 via a ball grid array (BGA), for example. In this example, electrode pads 111 are formed on the second surface 11b of the insulating layer. Electrode pads 911 are formed on a first surface 90a of the circuit board 90, at positions corresponding to the electrode pads 111 in a plan view. In addition, the electrode pads 111 are electrically connected to the corresponding electrode pads 911 via solder balls 920. The electrode pads 111 are electrically connected to various interconnect patterns and/or circuits (not illustrated) formed on the first surface 90a and/or a second surface 90b of the circuit board 90.

Of course, the circuit board 90 may form a part of the semiconductor device 1. That is, the semiconductor device 1 may include the circuit board 90 on which the wiring board 10 is electrically connected via the BGA or the like, for example.

Accordingly to each of the embodiments described above, it is possible to reduce the warp of the semiconductor device including the antenna and the semiconductor chip.

Although the embodiments are numbered with, for example, "first," "second," "third," or "fourth," the ordinal numbers do not imply priorities of the embodiments. Many other variations, modifications, and substitutions will be apparent to those skilled in the art.

For example, the semiconductor device 1 has the three-layer structure for the insulating layers, including the insulating layer 11 of the wiring board 10, the insulating layer 51 of the wiring board 50, and the insulating layer 71 of the wiring board 70. However, the semiconductor device may have a multi-layer structure for the insulating layers, including four or more insulating layers. In this case, the wiring board 50 may include a plurality of wiring boards arranged at a predetermined spacing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a first wiring board having a first surface mounted with a primary radiator, and a second surface mounted with a semiconductor chip;
    a second wiring board mounted with a secondary radiator, the primary radiator and the secondary radiator forming an antenna;
    a third wiring board, arranged between the first wiring board and the second wiring board, a predetermined gap being formed between the third wiring board and each of the first wiring board and the second wiring board;
    a first board-to-board connection member, arranged between the first wiring board and the third wiring board, forming a space between the first wiring board and the third wiring board, and regulating the spacing between the first wiring board and the third wiring board; and
    a second board-to-board connection member, arranged between the second wiring board and the third wiring board, forming a space between the second wiring board and the third wiring board, and regulating a spacing between the second wiring board and the third wiring board.

2. The semiconductor device as claimed in claim 1, wherein
    the first wiring board includes a first insulating layer,
    the second wiring board includes a second insulating layer,
    the third wiring board includes a third insulating layer, and
    the first insulating layer, the second insulating layer, and the third insulating layer have mutually different coefficients of thermal expansion.

3. The semiconductor device as claimed in claim 2, wherein the coefficient of thermal expansion of the third insulating layer falls in-between the coefficient of thermal expansion of the first insulating layer and the coefficient of thermal expansion of the second insulating layer.

4. The semiconductor device as claimed in claim 3, wherein the second insulating layer and the third insulating layer have dielectric constants and dielectric loss tangents lower than a dielectric constant and a dielectric loss tangent of the first insulating layer.

5. The semiconductor device as claimed in claim 2, wherein the second insulating layer and the third insulating layer have dielectric constants and dielectric loss tangents lower than a dielectric constant and a dielectric loss tangent of the first insulating layer.

6. The semiconductor device as claimed in claim 5, wherein at least one of the second insulating layer and the third insulating layer includes a fluororesin.

7. The semiconductor device as claimed in claim 2, wherein at least one of the second insulating layer and the third insulating layer includes a fluororesin.

8. The semiconductor device as claimed in claim 3, wherein at least one of the second insulating layer and the third insulating layer includes a fluororesin.

9. The semiconductor device as claimed in claim 4, wherein at least one of the second insulating layer and the third insulating layer includes a fluororesin.

10. The semiconductor device as claimed in claim 1, further comprising:
    a plurality of first electrode pads formed on the second surface of the first wiring board,
    wherein the plurality of first electrode pads are configured to electrically connect to a plurality of electrode pads that are provided at corresponding positions on a circuit board in a plan view.

11. The semiconductor device as claimed in claim 1, further comprising:
    a plurality of first electrode pads formed on the second surface of the first wiring board; and
    a circuit board having a plurality of second electrode pads formed on a surface opposing the second surface of the first wiring board,
    wherein the first electrode pads and the second electrode pads are provided at corresponding positions in a plan view, and are electrically connected via a ball grid array.

* * * * *